US011527384B2

(12) United States Patent
Burry et al.

(10) Patent No.: US 11,527,384 B2
(45) Date of Patent: Dec. 13, 2022

(54) APPARATUS AND TUNING METHOD FOR MITIGATING RF LOAD IMPEDANCE VARIATIONS DUE TO PERIODIC DISTURBANCES

(71) Applicant: MKS Instruments, Inc., Andover, MA (US)

(72) Inventors: Aaron M. Burry, Ontario, NY (US); Aaron T. Radomski, Conesus, NY (US); Mariusz Oldziej, Avon, NY (US); Peter Paul, Penfield, NY (US); Ross Reinhardt, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 17/102,598

(22) Filed: Nov. 24, 2020

(65) Prior Publication Data

US 2022/0165545 A1 May 26, 2022

(51) Int. Cl.
*H01J 37/32* (2006.01)

(52) U.S. Cl.
CPC .. *H01J 37/32183* (2013.01); *H01J 37/32155* (2013.01)

(58) Field of Classification Search
CPC ............... H01J 37/32; H01J 37/32183; H01J 37/32155; H02J 3/12; H03H 11/28; H05B 31/26
See application file for complete search history.

(56) References Cited

U.S. PATENT DOCUMENTS

| 7,602,127 | B2 | 10/2009 | Coumou |
| 8,110,991 | B2 | 2/2012 | Coumou |
| 8,395,322 | B2 | 3/2013 | Coumou |
| 9,041,292 | B2 | 5/2015 | Coumou |
| 9,947,514 | B2 | 4/2018 | Radomski et al. |
| 10,269,540 | B1 | 4/2019 | Carter et al. |
| 10,546,724 | B2 | 1/2020 | Radomski et al. |
| 10,741,363 | B1* | 8/2020 | Burry ............... H01J 37/32183 |

(Continued)

FOREIGN PATENT DOCUMENTS

KR 10-2020-0038316 A 4/2020

OTHER PUBLICATIONS

International Search Report and Written Opinion regarding International Application No. PCT/US2021/053139, dated Jan. 21, 2022.

(Continued)

*Primary Examiner* — Henry Luong
(74) *Attorney, Agent, or Firm* — Harness, Dickey & Pierce, P.L.C.

(57) ABSTRACT

A radio frequency (RF) power generation system includes a RF power source that generates a RF output signal delivered to a load. A RF power controller is configured to generate a control signal to vary the RF output signal. The controller adjusts a parameter associated with the RF output signal, and the parameter is controlled in accordance with a trigger signal. The parameter is adjusted in accordance with a cost function, and the cost function is determined by intruding a perturbation into an actuator that affects the cost function. The actuator may control an external RF output signal, and the trigger signal may vary in accordance with the external RF output signal.

30 Claims, 12 Drawing Sheets

(56) References Cited

U.S. PATENT DOCUMENTS

| | | |
|---|---|---|
| 10,821,542 B2 | 11/2020 | Nelson et al. |
| 2014/0055034 A1* | 2/2014 | Coumou .......... H01J 37/32082 |
| | | 315/111.21 |
| 2017/0018926 A1 | 1/2017 | Coumou et al. |
| 2017/0062187 A1* | 3/2017 | Radomski ............. H01J 37/321 |
| 2020/0411289 A1 | 12/2020 | Radomski et al. |

OTHER PUBLICATIONS

Kohng, Sei Zhen, Dragan Nesic, and Miroslav Krstic. "Iterative learning control based on extremum seeking." *Automatica* 66 (2016): 238-245.

* cited by examiner

APPARATUS AND TUNING METHOD FOR MITIGATING RF LOAD IMPEDANCE VARIATIONS DUE TO PERIODIC DISTURBANCES

FIELD

The present disclosure relates to RF generator systems and control of RF generators.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma fabrication is frequently used in semiconductor fabrication. In plasma fabrication, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

SUMMARY

A radio frequency (RF) generator includes a RF power source. The RF generator also includes a RF power controller coupled to the RF power source. The RF power controller is configured to generate a control signal to vary a RF output signal from the RF power source. The RF power controller is further configured to adjust a parameter associated with the RF output signal in accordance with a trigger signal. The parameter is adjusted in accordance with one of minimizing or maximizing a cost responsive to a perturbation of the parameter.

A radio frequency (RF) generator system includes a first power source configured to output a first RF signal applied to a load. The RF generator system also includes a second RF generator. The second RF generator includes a second power source configured to generate a second RF signal applied to the load. The sensed RF generator also includes a power controller coupled to the second power source. The power controller is configured to generate a control signal to vary the second RF signal, where the control signal adjusts a frequency of the second RF signal that varies in accordance with the first RF signal. The frequency adjustment varies in accordance with a cost responsive to a perturbation of the frequency of the RF signal.

A method for generating a radio frequency (RF) signal includes coupling a power controller to a RF power source. The method also includes controlling a first RF generator to output a first RF output signal. The method also includes adjusting an electrical parameter associated with applying the RF output signal to a load. The electrical parameter is adjusted in accordance with a cost, and the cost is one of minimized or maximized in accordance with a response to a perturbation of the electrical parameter and wherein the electrical parameter is adjusted relative to a trigger signal.

Implementations may include one or more of the following features. The method where the cost is determined in accordance with one of a reflected power or magnitude of a reflection coefficient. The method where a gradient is determined in accordance with the cost, and the electrical parameter is adjusted in accordance with the gradient. The method where electrical parameter is adjusted in accordance a plurality of adjustments arranged in a pattern. The method where the pattern varies in accordance with a period of an external RF output signal. An external RF output signal includes a plurality of bins, and where the parameter is perturbed in each bin. The method where the RF output signal is a source RF signal applied to a plasma chamber and the trigger signal varies in accordance with an external RF output signal, and the external RF output signal is a bias RF signal applied to the plasma chamber. The method where the RF power controller adjusts the electrical parameter in accordance with the trigger signal, where the trigger signal indicates a relative position of an external RF output signal. The method where the electrical parameter is one of a frequency or a frequency offset and includes a plurality of respective frequencies or frequency offsets used by the RF power controller to adjust electrical parameter in a predetermined order in accordance with the trigger signal. The method where the electrical parameter is adjusted in accordance with an intermodulation distortion caused by an external RF output signal.

A non-transitory computer-readable medium storing instructions controlling a first RF generator to output a first RF output signal to a load instructions also vary a value of an electrical parameter associated with one of the RF output signal or delivery of the RF output signal to the load. The value of the electrical parameter is determined in accordance with a cost, and the cost is one of minimized or maximized in accordance with a response to a perturbation of an electrical parameter and wherein value is varied relative to a trigger signal.

Implementations may include one or more of the following features. The non-transitory computer-readable medium where the cost varies in accordance with one of a reflected power or a magnitude of a reflection coefficient. The non-transitory computer-readable medium where a gradient is determined in accordance with the cost, and the electrical parameter is varied in accordance with the gradient. The non-transitory computer-readable medium where varying the value of the electrical parameter includes applying a plurality of electrical parameters arranged in a pattern and where the pattern varies in accordance with a period of an external RF output signal. The non-transitory computer-readable medium where the RF output signal is a source RF signal applied to a plasma chamber and the trigger signal varies in accordance with an external RF output signal, and the external RF output signal is a bias RF signal applied to the plasma chamber. The non-transitory computer-readable medium where an external RF output signal includes a plurality of bins, and where for each bin, the electrical parameter is perturbed in each bin. The non-transitory computer-readable medium where the parameter to be varied is a frequency offset and includes a plurality of frequencies of the RF output signal output in a predetermined order in accordance with the trigger signal. The non-transitory computer-readable medium where the parameter is varied in accordance with an intermodulation distortion caused by an external RF output signal.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
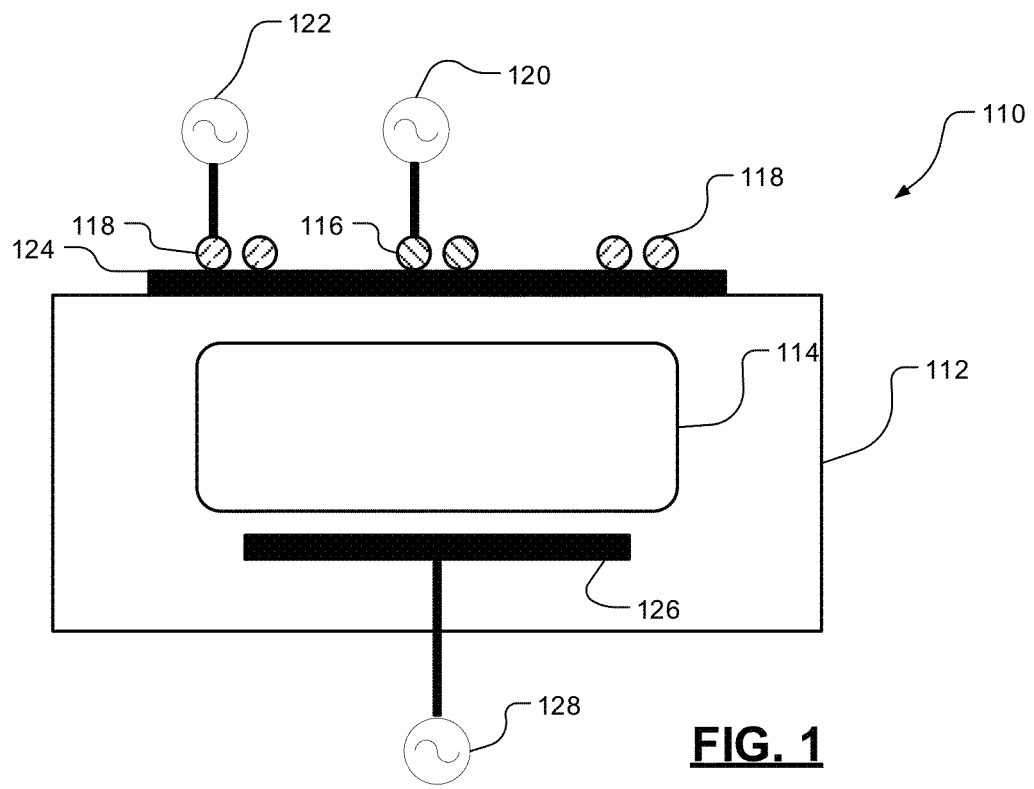
FIG. 1 shows a representation of an inductively coupled plasma system.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Forward power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency, and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. patent application Ser. No. 13/834,786, filed Mar. 15, 2013 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a representation of an inductively coupled plasma (ICP) system 10. ICP system 110 includes a non-linear load, such as a reactor, plasma reactor, or plasma chamber 112, which will be referred to interchangeably herein, for generating plasma 114. Power in the form of voltage or current is applied to plasma chamber 112 via a pair of coils, including a coil assembly that in various embodiments includes an inner coil 116 and an outer coil 118. Power is applied to inner coil 116 via a RF power generator or power source 120, and power is applied to outer coil 118 via RF power generator or power source 122. Coils 116 and 118 are mounted to dielectric window 124 that assists in coupling power to plasma chamber 112. A substrate 126 is placed in plasma chamber 112 and typically forms the work piece that is the subject of plasma operations. An RF power generator, power supply, or power source 128 (the terms may be used herein interchangeably) applies power to plasma chamber 112 via substrate 126. In various configurations, the power sources 120, 122 provide a source voltage or current to ignite or generate plasma 114 or control the plasma density. Also in various configurations, power source 128 provides a bias voltage or current that modulates the ions to control the ion energy or ion density of the plasma 114. In various embodiments, power sources 120, 122 are locked to operate at the same frequency, voltage, and current, with fixed or varying relative phases. In various other embodiments, power sources 120, 122 may operate at different frequencies, voltages, and currents, and relative phases.

Figure 2:
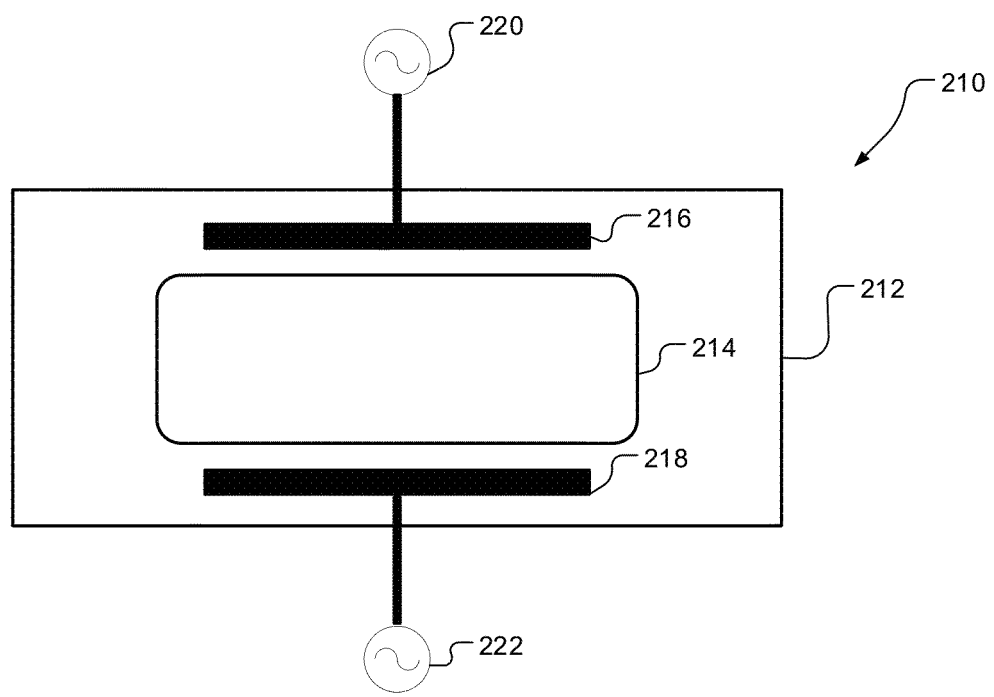
FIG. 2 shows a representation of a capacitively coupled plasma system.

FIG. 2 depicts a representation of a capacitively coupled plasma (CCP) system 210. CCP system 210 includes a plasma chamber 212 for generating plasma 214. A pair of electrodes 216, 218 placed within plasma chamber 212 connect to respective DC ($\omega=0$) or RF power generators or power sources 220, 222. In various embodiments, power source 220 provides a source voltage or current to ignite or generate plasma 214 or control the plasma density. In various embodiments, power source 222 provides a bias voltage or current that modulates the ions in the plasma to control the ion energy and/or ion density of the plasma 214. In various RF embodiments, power sources 220, 222 operate at relative phases when the sources are harmonically related. In various other embodiments, power sources 220, 222 operate at different frequencies, voltages, and currents, with fixed or varying relative phases. Also in various embodiments, power sources 220, 222 can be connected to the same electrode, while the counter electrode is connected to ground or to yet a third DC ($\omega=0$) or RF power generator (not shown).

Figure 3:
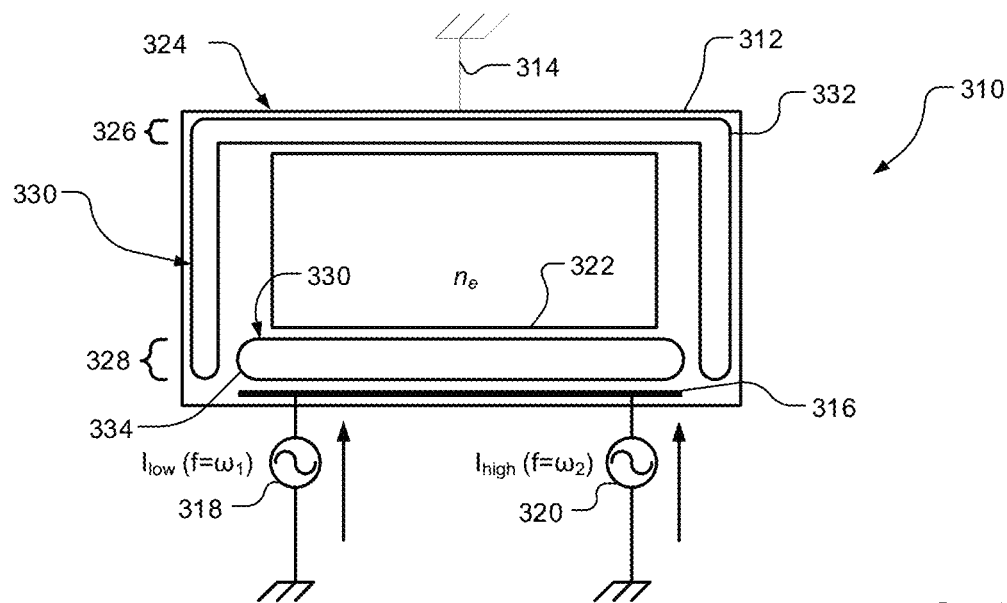
FIG. 3 shows a generalized representation of a plasma system arranged according to various embodiments of the present disclosure.

FIG. 3 depicts a cross-sectional view of a generalized representation of a dual power input plasma system 310. Plasma system 310 includes first electrode 312 connected to ground 314 and second electrode 316 spaced apart from first electrode 312. A first DC ($\omega=0$) or RF power source 318 generates a first RF power applied to second electrode 316 at a first frequency $f=\omega_1$. A second power source 320 generates a second DC ($\omega=0$) or RF power applied to second electrode 316. In various embodiments, second power source 320 operates at a second frequency $f=\omega_2$, where $\omega_2=n\omega$ that is the $n^{th}$ harmonic frequency of the frequency of first power source 318. In various other embodiments, second power source 320 operates at a frequency that is not a multiple of the frequency of the first power source 318.

Coordinated operation of respective power sources 318, 320 results in generation and control of plasma 322. As shown in FIG. 3 in schematic view, plasma 322 is formed within an asymmetric sheath 330 of plasma chamber 324. Sheath 330 includes a ground or grounded sheath 332 and a powered sheath 334. The sheath is generally described as the surface area surrounding plasma 322. As can be seen in schematic view in FIG. 3, grounded sheath 332 has a relatively large surface area 326. Powered sheath 334 has a small surface area 328. Because each sheath 332, 334 functions as a dielectric between the conductive plasma 322 and respective electrodes 312, 316, each sheath 332, 334 forms a capacitance between plasma 322 and respective electrodes 326, 328.

As will be described in greater detail herein, in systems in which a high frequency voltage source, such as second power source 320, and a low frequency voltage source, such as first power source 318, intermodulation distortion (IMD) products are introduced. IMD products result from a change in plasma sheath thickness, thereby varying the capacitance between plasma 322 and electrode 312, via grounded sheath 332, and plasma 322 and electrode 316, via powered sheath 334. The variation in the capacitance of powered sheath 334 generates IMD. Variation in powered sheath 334 has a greater impact on the capacitance between plasma 322 and electrode 316 and, therefore, on the reverse IMD emitted from plasma chamber 324. In some plasma systems grounded sheath 332 acts as a short circuit and is not considered for its impact on reverse IMD.

Figure 4:
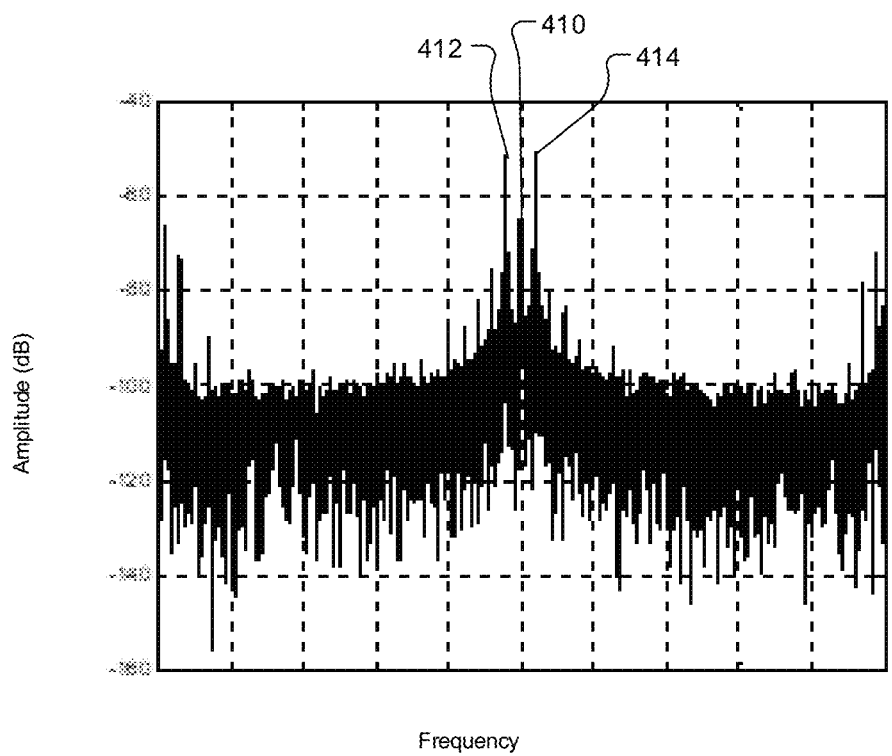
FIG. 4 is an example plot of intermodulation distortion (IMD) resulting from applying two signals of different frequency to a non-linear reactor.

FIG. 4 shows a plot of amplitude versus frequency for an exemplary power delivery system having a low frequency source such as first power source 318, and a high frequency source, such as second power source 320. FIG. 4 shows the amplitude of the reflected power with respect to the frequency. FIG. 4 includes a center peak 410 indicating the center frequency of operation of the high frequency power source, such as second power source 320 of FIG. 3. On either side of center peak 410, FIG. 4 also shows IMD components 412, 414 which represent the IMD introduced by the application of power from a low frequency power source, such as first power source 318 of FIG. 3. By way of nonlimiting example, if second power source 320 operates at a frequency of 60 MHz, and low frequency power source 318 operates at 400 kHz, IMD components can be found at 60 MHz+/−n*400 kHz, where n is any integer. Thus, peaks 412, 414 represent the high frequency +/− the low frequency of the respective power supplies. Driving an electrode at multiple harmonics, such as shown in FIG. 3, provides the opportunity to control DC self-bias electrically and to tailor the energetic levels of ion density.

Figure 5:
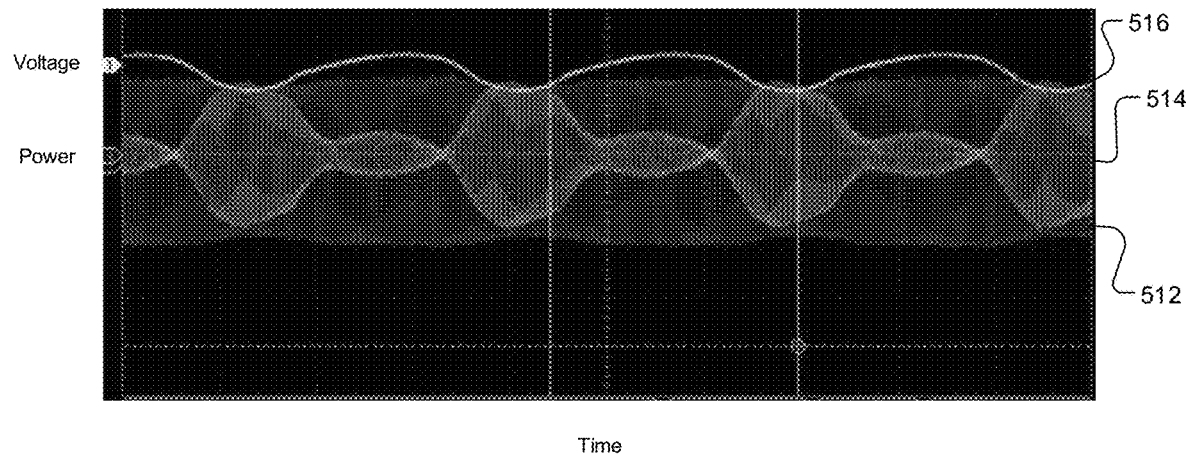
FIG. 5 shows voltage and power waveforms for a system having two RF signals applied to a load and the affect of intermodulation distortion on power delivery to the load.

FIG. 5 shows waveforms of forward power 512 and reverse or reflected power 514 for a higher frequency or source RF generator. By way of nonlimiting example, the source RF generator may operate at 60 MHz. FIG. 5 also shows a voltage waveform 516 indicating the output voltage of a lower frequency or bias RF generator, operating at, by way of nonlimiting example, 400 KHz. As can be seen in FIG. 5, the reflected power 514 of the source RF generator varies in accordance with the voltage fluctuations of voltage waveform 516 of bias RF generator. As can also be seen in FIG. 5, when the reflected power 514 increases, the power delivered to the load or the reactor (the difference between the forward power 512 and the reflected power 514) also decreases.

Figure 6:
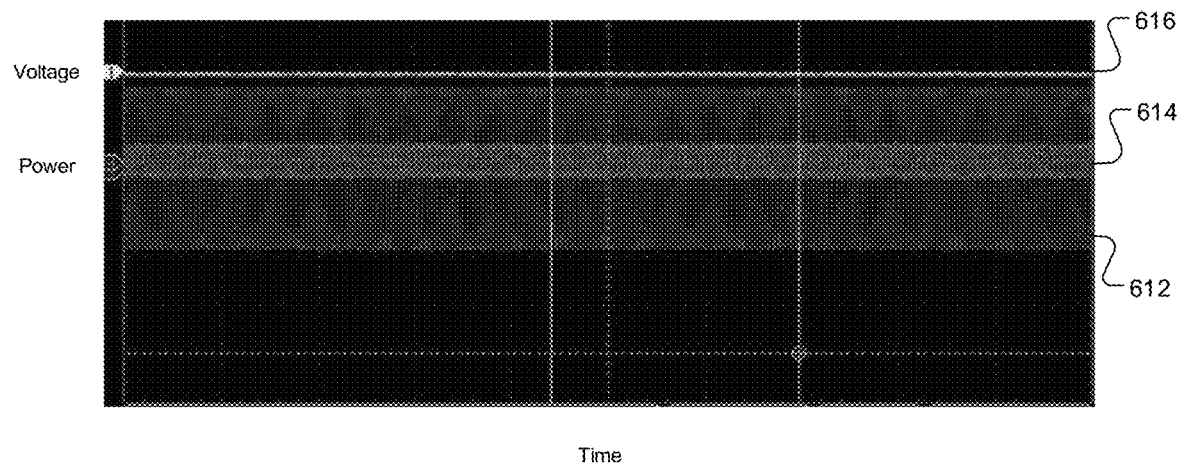
FIG. 6 shows voltage and power waveforms of a system having two RF signals applied to a load and power delivery when no intermodulation distortion between the two signals exists.

In FIG. 6, the voltage 616 output by bias RF generator has an amplitude of zero. When voltage 616 has a generally constant value, reverse or reflected power 614 has virtually no fluctuations. Therefore, forward power 612 delivered to the load is relatively constant and at a higher amplitude in the absence of fluctuations of reflected power 614. In various configurations, voltage 616 may be maintained constant without fluctuations when the bias RF generator is off.

As can be seen from FIGS. 5 and 6, fluctuation of voltage waveform 516 of the bias RF generator causes resultant IMD experienced at the load. The resultant IMD causes fluctuations in reverse power 514, that adversely affect delivery of forward power 512. By minimizing IMD, a more consistent forward power at a higher amplitude can be delivered to the load or process chamber.

Various approaches to responding to IMD-related load variations, such as shown in FIG. 5, include configuring the source RF generator to provide a higher output power to the load. A power increase will not improve the efficiency of the system and requires components selected to operate at the higher power levels. When operating at such higher power levels, other RF generator components must be selected not only to apply a greater forward power, but also to withstand higher reflected power levels. Thus, increasing power results in a higher RF generator cost.

Other approaches to addressing IMD-related load variations include implementing a disturbance cancellation system that adjusts the frequency actuator of the source RF generator in synchronization with operation of the bias RF generator. Since operation of the bias RF generator is typically periodic, adjustment of the frequency actuator of the source RF generator can be synchronized with the frequency of the lower frequency generator. An example of such an approach can be found with respect to U.S. Pat. No. 9,947,514, issued Apr. 17, 2018 and entitled "Plasma RF Bias Cancellation System", assigned to the assignee of the present application and incorporated by reference herein.

Another disturbance cancellation system is implemented by controlling actuators that affect matching network reactance, an example of which can be found with respect to U.S. Provisional Patent Application No. 62/923,959, filed Oct. 21, 2019 and entitled "Intermodulation Distortion Mitigation Using Electronic Variable Capacitor", assigned to the assignee of the present application and incorporated by reference herein. A further approach can be found with respect to controlling actuators such as power amplifier drive control, an example of which can be found with respect to U.S. patent application Ser. No. 16/452,716, filed Jun. 26, 2019 and entitled "High Speed Synchronization of Plasma Source/Bias Power Delivery" assigned to the assignee of the present application and incorporated by reference herein.

Returning to a disturbance cancellation system implemented by adjusting the frequency actuator of the source RF generator described above, disturbance cancellation requires tuning the frequency actuator profile. Such a profile may be generally described as a hopping pattern adjustment pattern, or correction pattern, since the frequency of the source RF generator changes in synchronization with the frequency of the bias RF generator. The approach may be generally described as frequency hopping.

Traditionally, frequency hopping or adjustment patterns were derived using manual tuning of the frequency profile via an iterative approach using a graphical user interface. Such an approach lacks efficiency and does not enable responding to disturbances that occur during the course of normal system operation, since the pattern is tuned in advance of the fabrication process occurring within the process or plasma chamber.

Figure 7:
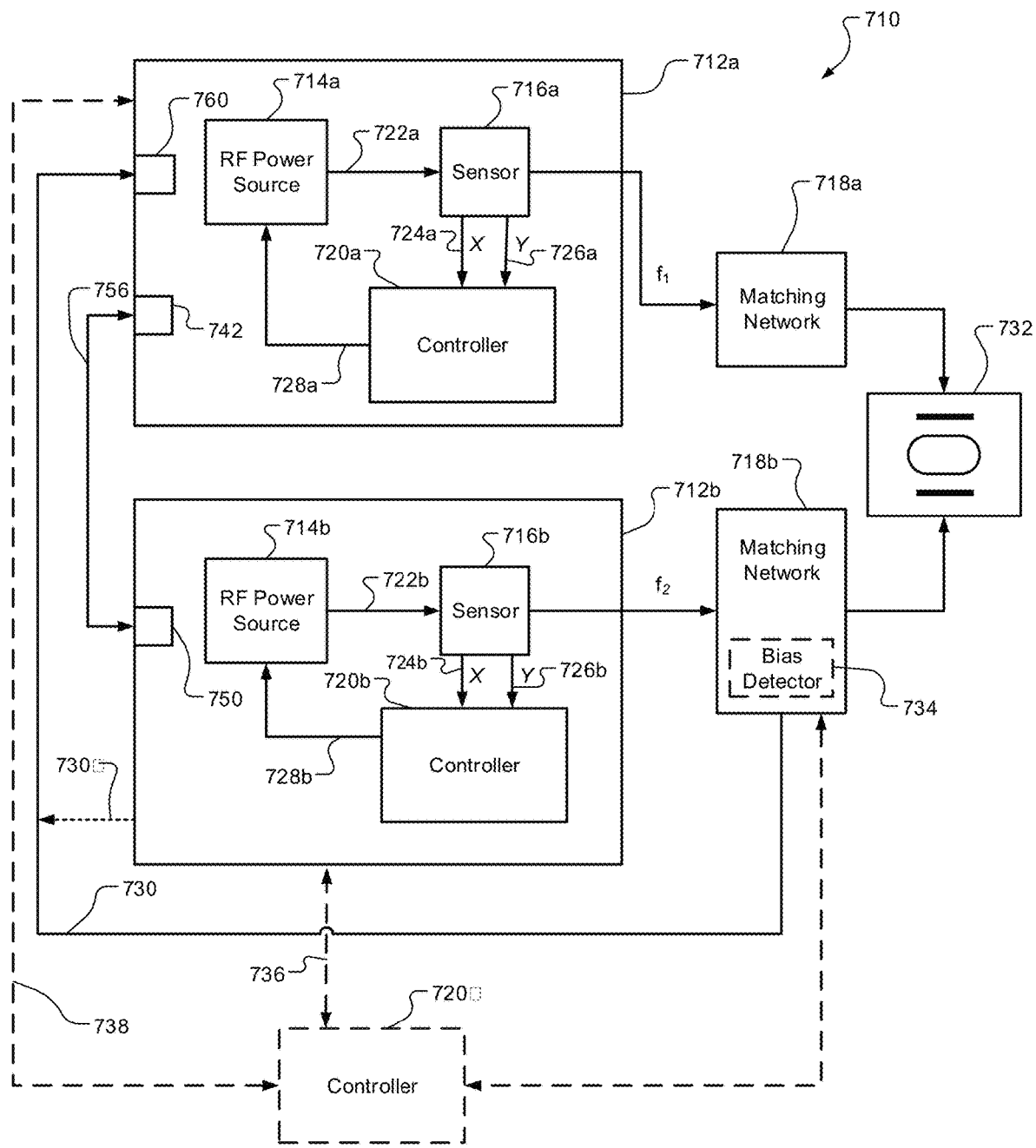
FIG. 7 is a schematic diagram of a power delivery system having multiple power supplies arranged according to various embodiments of the present disclosure.

FIG. 7 depicts a RF generator or power supply system 710. Power supply system 710 includes radio frequency (RF) generators or power supplies 712a, 712b, matching networks 718a, 718b, and load 732, such as a non-linear load, which may be a plasma chamber, process chamber, and the like. In various embodiments, RF generator 712a is referred to as a source RF generator or power supply, and matching network 718a is referred to as a source matching network. Also in various embodiments, RF generator 712b is referred to as a bias RF generator or power supply, and matching network 718b is referred to as a bias matching network. It will be understood that the components can be referenced individually or collectively using the reference number without a letter subscript or a prime symbol.

In various embodiments, source RF generator 712a receives a control signal 730 from matching network 718b, or a control signal 730' from bias RF generator 712b. As will be explained in greater detail, control signal 730 or 730' represents an input signal to source RF generator 712a that indicates one or more operating characteristics or parameters of bias RF generator 712b. In various embodiments, a bias detector 734 senses the RF signal output from matching network 718b to load 732 and outputs a synchronization or trigger signal 730 to source RF generator 712a. In various embodiments, synchronization or trigger signal 730' may be output from bias RF generator 712b to source RF generator 712a, rather than trigger signal 730. A difference between trigger or synchronization signals 730, 730' may result from the effect of matching network 718b, which can adjust the phase between the input signal to and output signal from matching network. Signals 730, 730' include information about the operation of bias RF generator 712b that in various embodiments enables predictive responsiveness to address periodic fluctuations in the impedance of plasma chamber 732 caused by the bias RF generator 712b. When control signals 730 or 730' are absent, RF generators 712a, 712b operate autonomously.

RF generators 712a, 712b include respective RF power sources or amplifiers 714a, 714b, RF sensors 716a, 716b, and processors, controllers, or control modules 720a, 720b. RF power sources 714a, 714b generate respective RF power signals 722a, 722b output to respective sensors 716a, 716b. Sensors 716a, 716b receive the output of RF power sources 714a, 714b and generate respective RF power signals $f_1$ and $f_2$. Sensors 716a, 716b also output signals that vary in accordance with various parameters sensed from load 732.

While sensors 716a, 716b, are shown within respective RF generators 712a, 712b, RF sensors 716a, 716b can be located externally to the RF power generators 712a, 712b. Such external sensing can occur at the output of the RF generator, at the input of an impedance matching device located between the RF generator and the load, or between the output of the impedance matching device (including within the impedance matching device) and the load.

Sensors 716a, 716b detect various operating parameters and output signals X and Y. Sensors 716a, 716b may include voltage, current, and/or directional coupler sensors. Sensors 716a, 716b may detect (i) voltage V and current I and/or (ii) forward power $P_{FWD}$ output from respective power amplifiers 714a, 714b and/or RF generators 712a, 712b and reverse or reflected power $P_{REV}$ received from respective matching network 718a, 718b or load 732 connected to respective sensors 716a, 716b. The voltage V, current I, forward power $P_{FWD}$, and reverse power $P_{REV}$ may be scaled and/or filtered versions of the actual voltage, current, forward power, and reverse power associated with the respective power sources 714a, 714b. Sensors 716a, 716b may be analog and/or digital sensors. In a digital implementation, the sensors 716a, 716b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 716a, 716b generate sensor signals X, Y, which are received by respective controllers or power control modules 720a, 720b. Power control modules 720a, 720b process the respective X, Y signals 724a, 726a and 724b, 726b and generate one or a plurality of feedforward and/or feedback control signals 728a, 728b to respective power sources 714a, 714b. Power sources 714a, 714b adjust the RF power signals 722a, 722b based on received feedback and/or feedforward control signal. In various embodiments, power control modules 720a, 720b may control matching networks 718a, 718b, respectively, via respective control signals. Power control modules 720a, 720b may include, at least, proportional integral derivative (PID) controllers or subsets thereof and/or direct digital synthesis (DDS) component(s) and/or any of the various components described below in connection with the modules.

In various embodiments, power control modules 720a, 720b are PID controllers or subsets thereof and may include functions, processes, processors, or submodules. Control signals 728a, 728b may be drive signals and may include DC offset or rail voltage, voltage or current magnitude, frequency, and phase components. In various embodiments, control signals 728a, 728b can be used as inputs to one or multiple control loops. In various embodiments, the multiple control loops can include a proportional-integral-derivative (PID) control loop for RF drive, and for rail voltage. In various embodiments, control signals 728a, 728b can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein.

In various embodiments, power supply system 710 can include controller 720'. Controller 720' may be disposed externally to either or both of RF generators 712a, 712b and may be referred to as external or common controller 720'. In various embodiments, controller 720' may implement one or a plurality of functions, processes, or algorithms described herein with respect to one or both of controllers 720a, 720b.

Accordingly, controller 720' communicates with respective RF generators 712a, 712b via a pair of respective links 736, 738 which enable exchange of data and control signals, as appropriate, between controller 720' and RF generators 712a, 712b. For the various embodiments, controllers 720a, 720b, 720' can distributively and cooperatively provide analysis and control along with RF generators 712a, 712b. In various other embodiments, controller 720' can provide control of RF generators 712a, 712b, eliminating the need for the respective local controllers 720a, 720b.

In various embodiments, RF power source 714a, sensor 716a, controller 720a, and matching network 718a can be referred to as source RF power source 714a, source sensor 716a, source controller 720a, and source matching network 718a. Similarly in various embodiments, RF power source 714b, sensor 716b, controller 720b, and matching network 718b can be referred to as bias RF power source 714b, bias sensor 716b, bias controller 720b, and bias matching network 718b. In various embodiments and as described above, the source term refers to the RF generator that generates a plasma, and the bias term refers to the RF generator that tunes the plasma Ion Energy Distribution Function (IEDF). In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 712a and bias RF generator 712b include multiple ports to communicate externally. Source RF generator 712a includes digital communication port 742. Bias RF generator 712b includes a digital communication port 750. Digital communication port 742 of source RF generator 712a and digital communication port 750 of bias RF generator 712b communicate via a digital communication port 756.

Figure 8:
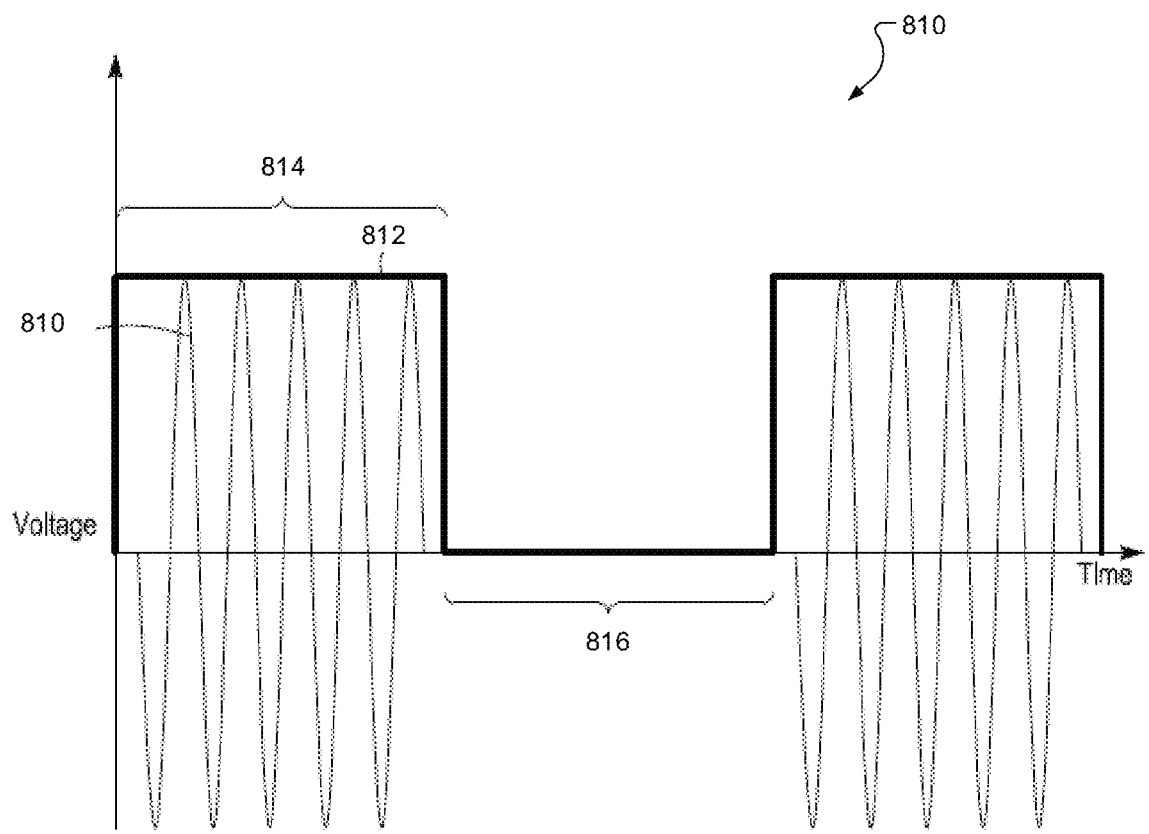
FIG. 8 shows waveforms of a RF signal and a pulse modulating the RF signal.

FIG. 8 depicts a plot of voltage versus time to describe a pulse mode of operation for delivering power to a load, such as load 732 of FIG. 7. In FIG. 8, RF signal 810 is modulated by pulse 812. As shown at period or region 814 of pulse 812, when pulse 812 is ON, RF generator 732 outputs RF signal 810. Conversely, during period or region 816 of pulse 812, pulse 812 is OFF, and RF generator 732 does not output RF signal 810. Pulse signal 812 can repeat at a constant duty cycle or a variable duty cycle. Further, pulse signal 812 need not be embodied as a square wave as shown in FIG. 2. Further yet, pulse 812 can have multiple ON and OFF regions of varying amplitude and duration. The multiple regions may repeat within a fixed or variable period.

The present disclosure is directed to compensating for periodic disturbances caused by variation of an electrical parameter of a RF power delivery system. In RF generator applications, the RF frequency of the signal applied to the load affects the impedance of the load. In various configurations, frequency is used as a control actuator to minimize power reflected from the load back to the RF generator. The RF frequency is varied in order to minimize the reflected power and maximize the forward power delivered to the load.

As discussed above, application of a second RF signal, such as a bias RF generator, which applies a lower frequency RF signal to a load, can impact the power delivered by a first or source RF generator, which typically applies a higher RF frequency to the load. In various disturbance cancellation systems, the period of the lower frequency generator is divided into a selected number of bins. In the source RF generator, the RF frequency of the signal output by the source RF generator is adjusted in accordance with the expected disturbance from the periodic signal output by the lower frequency generator. Further, the RF frequency of the source RF generator is adjusted in accordance with each of the bins of the RF signal output by the lower frequency or bias RF generator. The frequency offsets applied to the RF frequency signal output by the higher frequency or source RF generator defines a hopping pattern intended to reduce or minimize the impact of the load fluctuations caused by the IMD from the RF signal output by the lower frequency or source RF generator. This approach thus provides a feed-forward connection to the RF source frequency actuator, with the bin-by-bin frequency-hopping pattern providing correction values or offsets.

Figure 9:
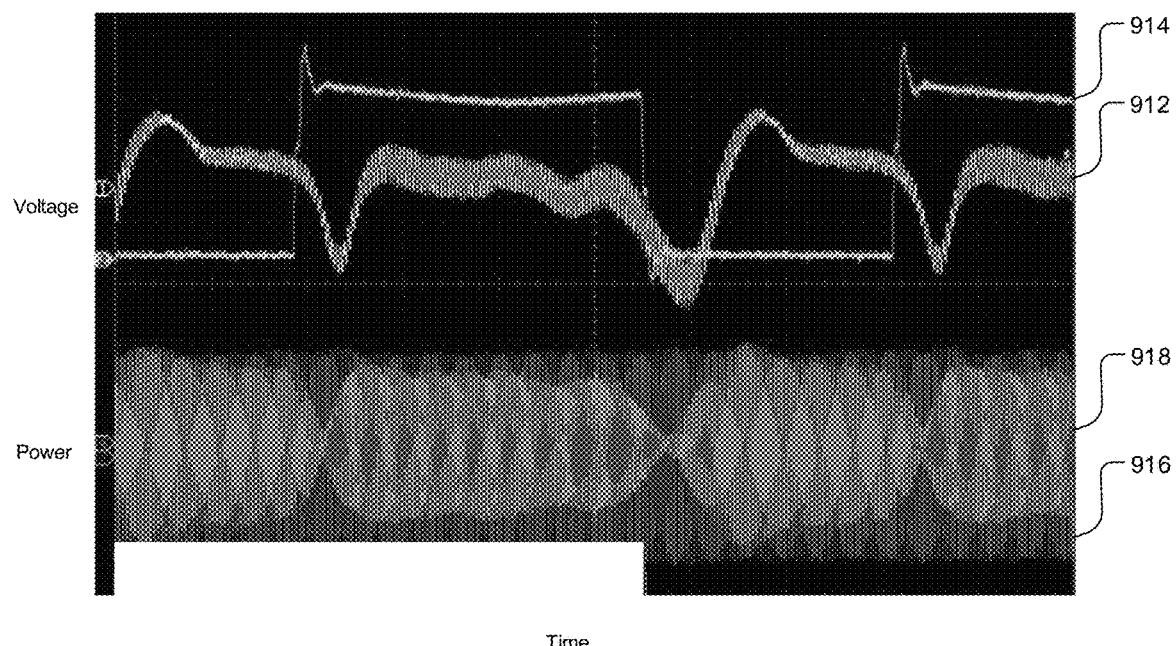
FIG. 9 shows voltage and power waveforms for a system having two RF signals applied to a load in which no periodic disturbance compensation is applied.

FIG. 9 discloses waveforms corresponding to voltage and power of RF generators that generate RF signals applied to a common load, such as a plasma chamber or a reactor. Waveform 912 represents a signal related to the RF signal output by a bias RF generator. By way of nonlimiting example, the bias RF generator operates at 400 KHz. Waveform 914 is a generally square wave synchronization pulse that varies in accordance with the RF signal output by the bias RF generator. Waveform 916 represents a forward power output by a source RF generator output to a load, such as load 732 of FIG. 7. Waveform 918 indicates power reflected back from the load by way of nonlimiting example, the source RF generator operates at 60 MHz.

Figure 10:
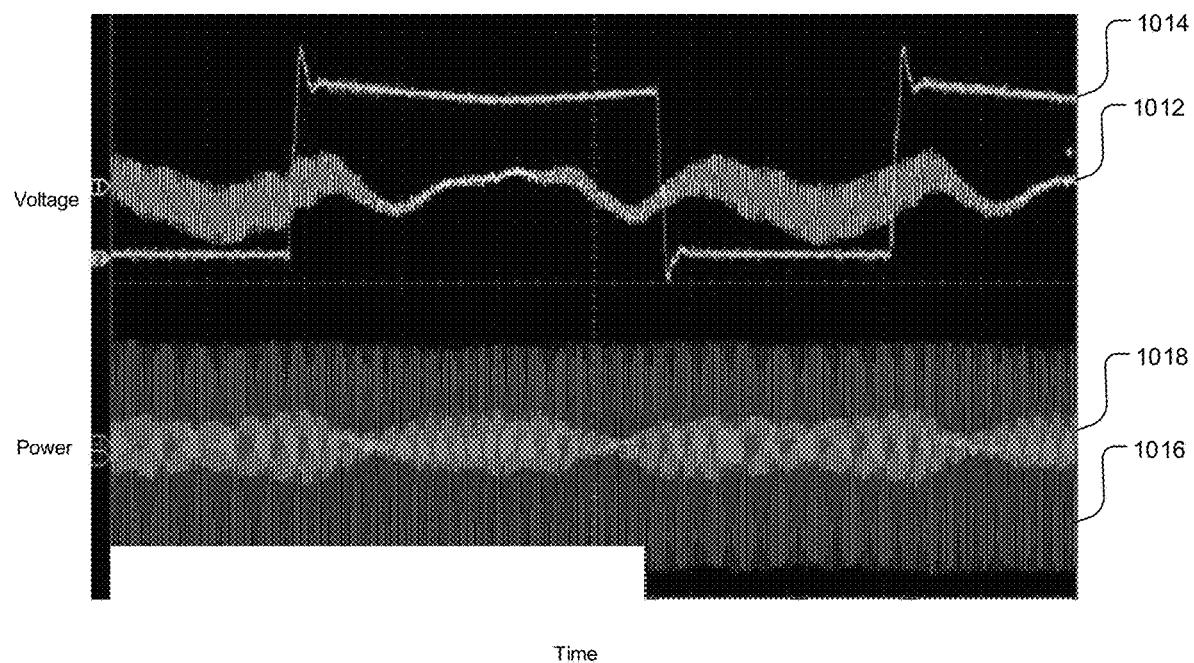
FIG. 10 shows voltage and power waveforms of the system having two RF signals applied to a load in which periodic disturbance compensation is applied.

With reference to FIG. 10, FIG. 10 shows similar waveforms from FIG. 9 with the RF signal output by the source RF generator 712a of FIG. 7, for example, adjusted using a frequency hopping or correction pattern. As described above, waveform 1012 indicates a forward voltage output by bias RF generator 712b of FIG. 7, for example. Similar to FIG. 9, waveform 1014 represents a synchronization pulse related to the output of the RF signal from a bias RF generator such as RF generator 712b. As can be seen in FIG. 10, application of frequency offsets to the output from RF generator 712a significantly reduces reverse power 1018 and increases power delivered to the load or reactor (the difference between the forward power 1016 and the reverse power 1018). Thus, using disturbance cancellation described herein, reflected power 1018 is reduced and delivered power is increased.

In various embodiments, a challenge to disturbance cancellation is how to determine the required frequency offset, adjustment, or correction actuations for implementing a frequency hopping, adjustment, or correction pattern. The present disclosure describes an extremum seeking iterative learning control (ILC) approach to determine a frequency actuation profile, or hopping pattern, to mitigate the effects of IMD from periodic load impedance variation.

Figure 11:
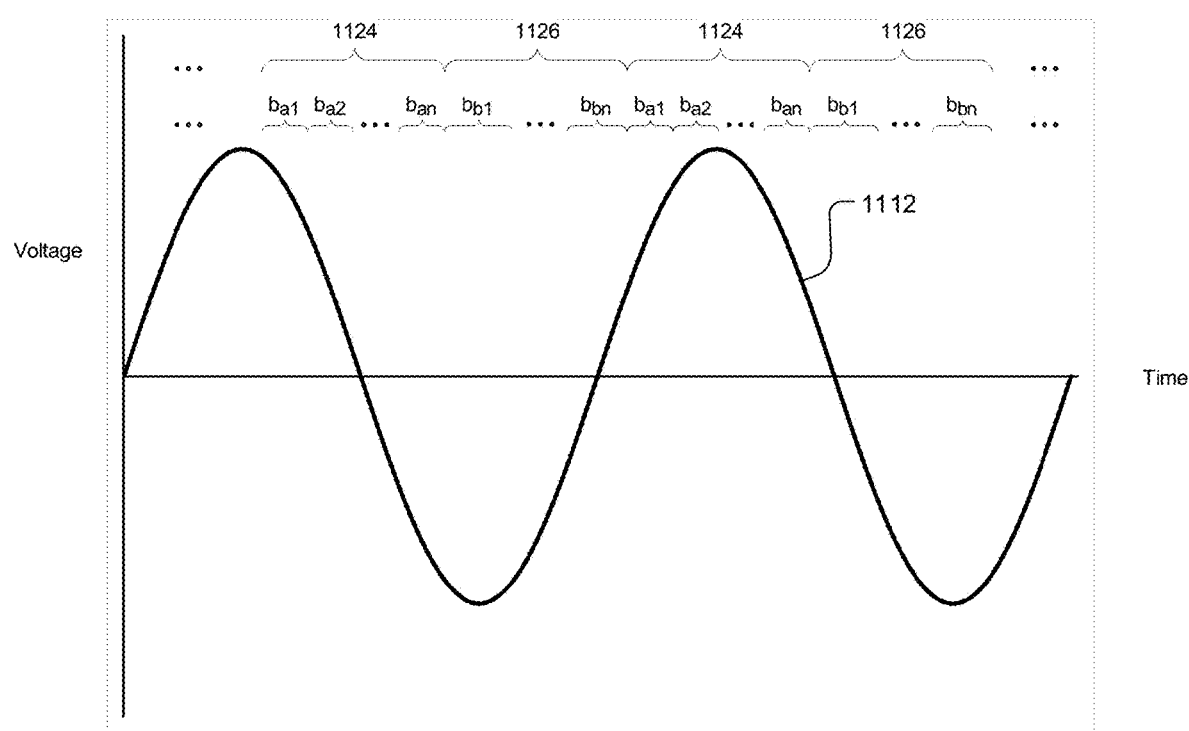
FIG. 11 shows a waveform subdivided into bins to describe an periodic disturbance compensation system described herein.

FIG. 11 shows a waveform 1112 of voltage versus time for a RF signal output by a higher frequency or source RF generator, such as RF generator 712a of FIG. 7. Waveform 1112 includes a first section 1124 and a second section 1126. In various aspects, sections 1124, 1126 can be further divided into bins $b_x$, where x generically denotes any bin of the plurality. As shown in FIG. 11, section 1124 is subdivided into bins, such as bins $b_{a1}$, $b_{a2}$, ..., $b_{an}$. Similarly, section 1126 can be subdivided into bins $b_{b1}$, $b_{b2}$, ..., $b_{bn}$. In various embodiments, both the width and the number of bins within each section 1124, 1126 and between each section 1124, 1126 can vary. The width of each bin within section 1124 may be the same width or varying widths. Likewise, the width of each bin of section 1126 may be the same width or varying widths. Further, the number of bins that comprise section 1124 and the number of bins that comprise section 1126 can vary. For pulsed implementations, the bin width may be narrow for bins in proximity to a pulse edge and wider over a relatively steady state portion of a pulse.

In various embodiments, any or one of bins $b_x$ can define segments of a pattern of electrical parameter hops, adjustments, or corrections that define a parameter hopping, adjustment, or correction pattern to control, by way of nonlimiting example, frequency of the source RF generator or other electrical parameter actuations that mitigate or reduce IMD or otherwise improve operation of a RF generator system. Such parameters can include frequency, amplitude, and phase of the RF signal output by the RF generator, such as RF generator 712a of FIG. 7, match network control parameters, and other control parameters. Other parameters can include various actuators in a RF power delivery system, such as reactances including inductance and capacitance in a matching network. Control of such reactances may be implemented using electronically variable capacitances or inductances. In various embodiments, the width of a bin $b_x$ may be selected so that the bin spacing is small compared to the fastest rate of change in the reflected power profile caused by the IMDs. If the bins are too wide, then only lower frequency content in the IMD profile can be properly corrected. In some embodiments, the bin widths may be chosen based on hardware or software requirements that might limit the number of bin values that can be processed and written as frequency offsets from the generator.

In various embodiments, the width of sections 1124 or 1126 is determined in accordance with the periodic nature of a signal causing a variation in reflected power in a load driven by waveform 1112. By way of nonlimiting example, in a RF generator system that includes a source RF generator operating at 60 MHz and a bias RF generator operating at 400 KHz, the widths of sections 1124, 1126 may be set in accordance with the period of the 400 KHz bias RF generator output signal. Since the bias RF generator output signal causes a periodic disturbance in the load in the form of IMD, the adjustment pattern formed by bins $b_x$ within sections 1124, 1126 correct for IMD when the patterns are applied to the source RF signal in relation operation of the bias RF generator. In the example described herein in which the source RF generator operates at 60 MHz and the bias RF generator operating at 400 KHz, the source RF waveform completes approximately 150 cycles over one bias RF waveform. Thus sections 1124, 1126 are not shown to scale relative to waveform 1112.

As will be described herein, each bin will be assigned an offset frequency or frequency adjustment, also referred to a hopping, adjustment, or correction parameter, applied to the RF signal output by source RF generator 712a in synchronization with bias RF waveform 1112 of FIG. 11. The offsets or corrections associated with each bin define a frequency-hopping pattern. The frequency offset or adjustment associated with each bin may be determined as a calibration step and stored in memory or updated continuously. Thus, in various configurations, frequency hopping or adjustment of the source RF frequency is a feed forward control, and the feed forward values within a bin are updated based on measurements taken over one or more prior pulses for corresponding bins.

Each bin $b_x$ can define a hopping frequency, frequency offset, adjustment, or correction parameter of the RF signal output by RF generator 712a. The frequency can be selected to vary the impedance match between the RF generator 712a and the load 732 to control power delivered to the load. Further, in various embodiments, bins $b_x$ of FIG. 11 can define adjustment of various electrical parameters of source RF generator of a matching network, such as matching network 718.

Figure 12:
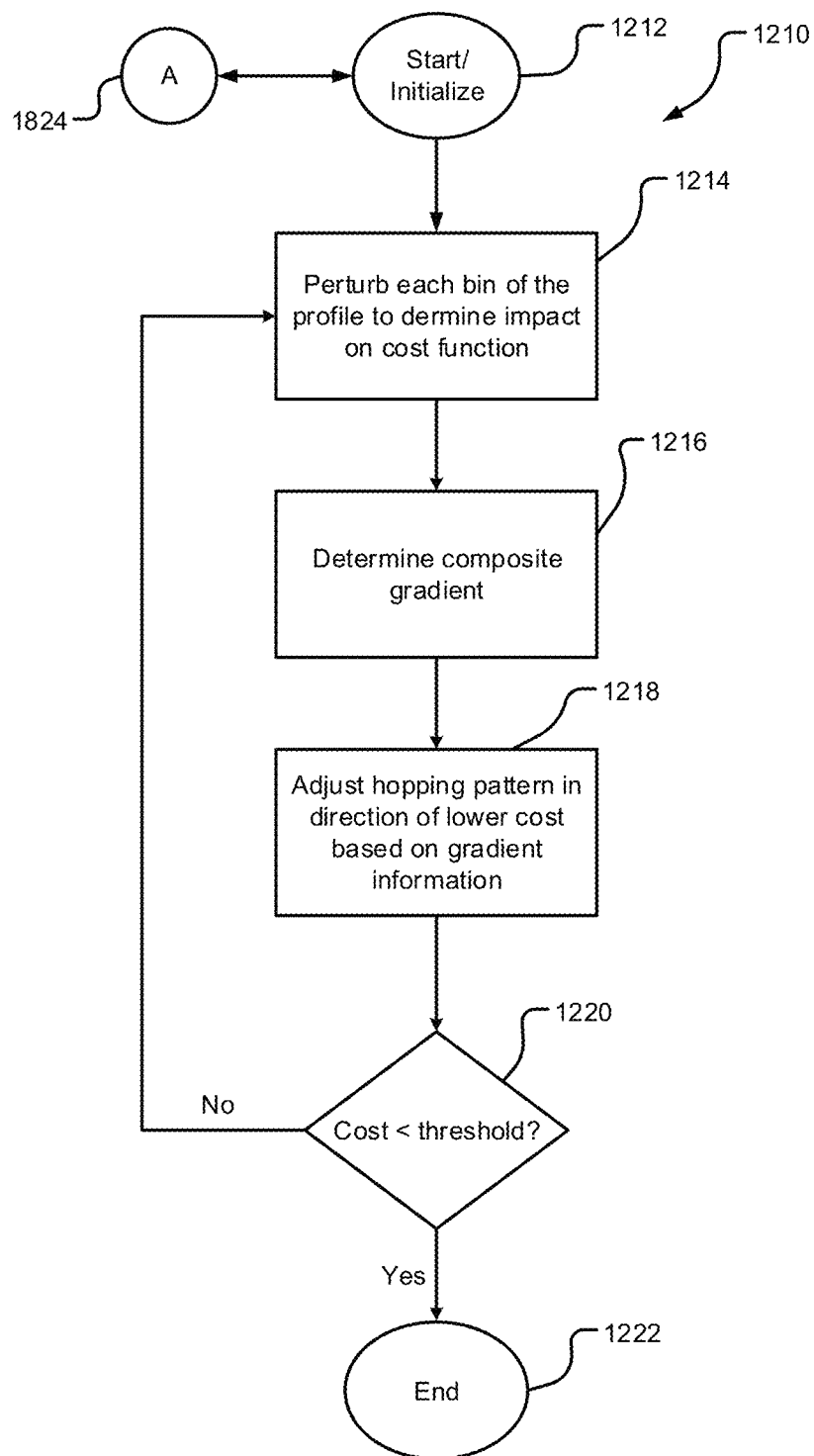
FIG. 12 shows a flow chart of a periodic disturbance compensation system.
Figure 13:
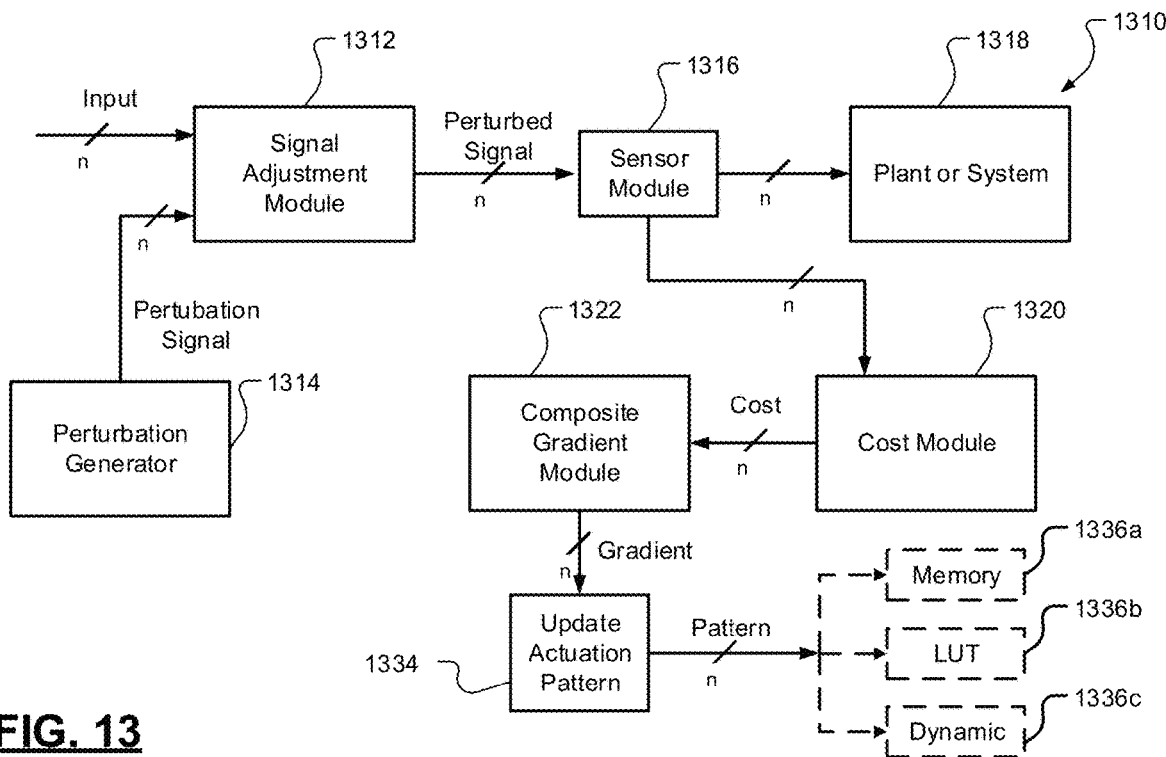
FIG. 13 shows a functional block diagram of a periodic disturbance compensation system.

FIG. 12 shows a flowchart 1210 and FIG. 13 shows a functional block diagram 1310 that describe determining the electrical parameter for each bin of FIG. 11 to determine adjustment of an associated electrical parameter and to determine the adjustment value of the electrical parameter in order to improve operation of a RF generator system. Describing operation of FIGS. 12 and 13 generally, the electrical parameter adjustment or correction profile, such as a frequency hopping profile, is determined iteratively by independently perturbing an actuator value each iteration. In various embodiments, the electrical parameter may be frequency. The independent perturbation involves either increasing or decreasing the actuator related to an electrical parameter each iteration. Each iteration perturbs one or more bins related to the electrical parameter, such as bins $b_x$ described in FIG. 11, and the impact of the perturbation on the output metric or metrics of interest is determined. In various configurations, the output metric or metrics of interest can be one or more of average reflected power, delivered power, or average magnitude of the reflection coefficient over the operating period of the bias generator, such as RF generator 712b of FIG. 7. The metric of interest can also be referred to as a cost function, which is optimized to indicate when a sufficient adjustment pattern has been determined. In various embodiments, the actuator to be perturbed includes one or more of frequency, amplitude, or phase of a signal applied to a load, or a reactance, such as inductance or capacitance, that affects power delivery to a load.

With reference to FIG. 12, control begins at block 1212 and proceeds to block 1214. At block 1214, each bin $b_x$ of the profile is perturbed in order to determine the impact of the perturbation of each bin on a cost function. With reference to FIG. 11, the actuator or actuators corresponding to each bin bare perturbed, increased or decreased by a set amount, in order to cause a corresponding variation in the output metric of interest. At block 1214, each of bins $b_x$ of FIG. 11 is varied by a small amount in a similar manner, and the output metric of interest is analyzed to determine the impact of the perturbation on the cost function associated with the metric of interest.

With reference to FIG. 13, functional block diagram 1310 includes a signal adjustment module 1312. Signal adjustment module 1312 receives one or a plurality (n) of input signals. In various embodiments, the one or a plurality (n) of input signals include a signal or signals to be adjusted by the adjustment pattern, such as the RF output from source RF generator. Signal adjustment module 1312 also includes one or a plurality (n) of perturbation signals from perturbation generator 1314. The signal adjustment module outputs one or a plurality (n) of perturbed signals in accordance with the one or a plurality (n) of inputs and the one or a plurality (n) of perturbation signals. Signal adjustment module 1312 can mix, combine, or otherwise process one or a plurality (n) of the input signals and one or a plurality (n) of the perturbation signals to generate one or a plurality (n) of perturbation signals. The one or a plurality (n) of perturbed signals are input to one or a plurality (n) of sensors of sensor module 1316 and also output to plant or system 1318. The perturbed signals applied to plant or system 1318 may cause variation in the output metric or metrics of interest determined by sensor or sensors of sensor module 1316. Sensor module 1316 outputs one or a plurality (n) of sensed values to cost module 1320. Cost module 1320 determines one or a plurality (n) of costs as will be described herein. FIGS. 12 and 13 describe an extremum seeking iterative learning control (ILC) approach to learn the frequency actuation profile or hopping pattern required to mitigate the periodic load variation.

Returning to FIG. 12, control proceeds to block 1216 which determines a composite gradient for the variation in the cost function. With reference to FIG. 12, composite gradient module 1322 receives the one or a plurality (n) of costs and determines a composite gradient at block 1218. Actuator updates $u_i(k+1)$ are determined based on a gradient of the one or a plurality (n) of cost functions gradient. The actuator updates $u_i(k+1)$ can be determined using the gradient descent method described below with respect to Equation (1):

$$u_i(k+1) = u_i(k) - \mu G_i \quad (1)$$

where:
$u_i$ is the frequency actuation at bin i,
$G_i$ is the measured cost gradient resulting from perturbing bin i,
$\mu$ is a tunable learning rate, and
k is the iteration index.

The measured cost gradient is the change from a baseline due to injection of the perturbation signal. That is, the measured cost gradient is a difference between output from sensor module 1316 based upon no perturbation signal applied to signal adjustment module 1312, and the output from sensor module 1316 based upon a perturbed input signal applied to signal adjustment module 1312. Because the gradient points in the direction of an increase, the negative sign in Equation (1) insures that the iterations progress toward minimizing cost.

Referring to FIG. 12 at block 1216, $G_i$ of Equation (1) can be determined using various approaches. In one approach, the bin actuator value, such as the one or a plurality (n) of perturbed signals output by signal adjustment module 1312, can be adjusted in one direction and the difference in the cost metric between the baseline (unperturbed) value and the perturbed value can be used to estimate the local gradient $\hat{G}_i$ to determine an actuator response slope as described below in Equation (2):

$$\hat{G}_i = \frac{(C_{pert} - C_{base})}{U_{pert}} \quad (2)$$

where:
$C_{pert}$ is the cost with the perturbation injected,
$C_{base}$ is the cost without the perturbation injected, and
$U_{pert}$ is the perturbation amplitude.

The measured cost gradient is the difference between the unperturbed output metric and the perturbed output metric divided by the amount of perturbation.

In other approaches, the actuator can be adjusted up and adjusted down, or in a first direction and in an opposite direction, to estimate a local gradient $\hat{G}_i$ as described below in Equation (3).

$$\hat{G}_i = \frac{(C_{up} - C_{down})}{2U_{pert}} \quad (3)$$

where:
$C_{up}$ is the cost of the bin actuator increased (perturbed) by a fixed amount,
$C_{down}$ is the cost with the bin actuator decreased (perturbed) by the same fixed amount, and
$U_{pert}$ is the magnitude of the actuator change.

The approach of Equation (3) is more robust with respect to local non-linearities, such as quadratic cost function shapes, than the single direction perturbation method described above with respect to Equation (2).

Other methods for estimating the local gradient may be used. In one nonlimiting example, a second-order polynomial can be fit to the output values or costs using the baseline, $C_{up}$, and $C_{down}$, cost values used in their associated bin actuations. The second order polynomial can then be used to calculate the estimated slope at the center actuator value.

Returning to FIG. 12, control proceeds to block 1218 which determines the hopping pattern in direction of lower costs based on gradient information $\hat{G}_i$, obtained at block 1216. The adjustment or hopping pattern is thus adjusted in accordance with Equation (1) described above. Control then proceeds to block 1220, which determines if the cost is less than a predetermined threshold. If the cost is not less than the predetermined threshold, control proceeds to block 1214 in order to perform another iteration of perturbation at block 1214, cost gradient determination at block 1216, and adjustment of the parameter adjustment or correction pattern at block 1218. If the cost is less than a predetermined threshold as determined at block 1220, control proceeds to end at block 1222.

Returning to FIG. 13 at block 1322, following determination of the composite gradient, the composite gradient is output to update module 1334 which determines the actuator updates as shown in Equation (1) in accordance with the composite gradient determined at composite gradient module 1332. The composite gradient $\hat{G}$ may be represented as a vector associated with bin actuators i, where $\hat{G}=[G_1, G_2, \ldots, G_n]$. Update module 1334 outputs a parameter adjustment pattern or hopping pattern to one or more of memory 1336a, look up table (LUT) 1336b, or dynamically the adjustment pattern as shown at 1336c. The parameter adjustment pattern can adjust one or a plurality (n) of actuators to control one or a plurality of costs in accordance with a MIMO approach to parameter adjustment. The parameter adjustment values in the parameter correction pattern may indicate a parameter offset value or the parameter value.

Returning to block 1214 of FIG. 12 and block 1320 of FIG. 13, the cost function can be determined using various approaches. In one approach, the cost is the average of a measured value, such as reflected power over the period of the lower frequency generator. In various other approaches, the cost function metric may be the average magnitude of the reflection coefficient over the period of the lower frequency generator, such as low frequency or bias generator 712b of FIG. 7. In various other approaches, the cost may vary in accordance with delivered power or the magnitude of the reflection coefficient. In addition to averaging, other metrics for reflected power or average magnitude can be used, including maximum, minimum, or other statistical analysis of such values.

One generalized representation of the cost function may include individually weighted terms for a different cost component as described below in Equation (4):

$$C_{total} = \Sigma_j W_j C_j \quad (4)$$

Where, $C_j$ and $W_j$ values represent cost components and individual weights assigned to the cost components, respectively. That is, $C_{total}$ can be described as the sum of various weighted cost components, such as measured reflected power or magnitude of a reflection coefficient at negative and positive zero crossings of the lower frequency or bias RF signal can be summed into the cost function. That is, the measured reflected power or the magnitude of the reflection coefficient at a negative zero crossing may be assigned a first weight and the value of the measured reflected power or magnitude of the reflection coefficient at the negative zero crossing may be assigned the first value and the measured reflected power or magnitude of reflection coefficient may be assigned a second cost value at a second weight.

The cost function can also include additional terms to improve the smoothness of the actuator profile across the full correction or hopping pattern as described below with respect to Equation (5):

$$C_{total} = W_{avg}C_{avg} + W_{neg}C_{neg} + W_{pos}C_{pos} + W_{smooth}C_{smooth} \quad (5)$$

where:

$C_{avg}$ is the average value of the cost, $W_{avg}$ is the weight assigned to the average value of the cost, $C_{neg}$ is the cost at the negative to zero crossing of the periodic disturbance or bias RF signal, $W_{neg}$ is the weight assigned to the cost at the negative zero crossing of the bias RF signal, $C_{pos}$ is the cost at the positive zero crossing of the periodic disturbance or bias RF signal, $W_{pos}$ is the weight assigned to the cost at the positive zero crossing of the bias RF signal, $C_{smooth}$ is the cost of the smoothness metric, and $W_{smooth}$ is the weight assigned to the cost of the smoothness metric.

The smoothness metric $C_{smooth}$ can take a number of forms. In one form, the smoothness metric comprises a deviation of the differences of the output metric or cost between consecutive bin actuations. In another form, the smoothness metric $C_{smooth}$ is the sum-square values of the second order differences in the costs or output metric consecutive bin actuations.

Figure 14:
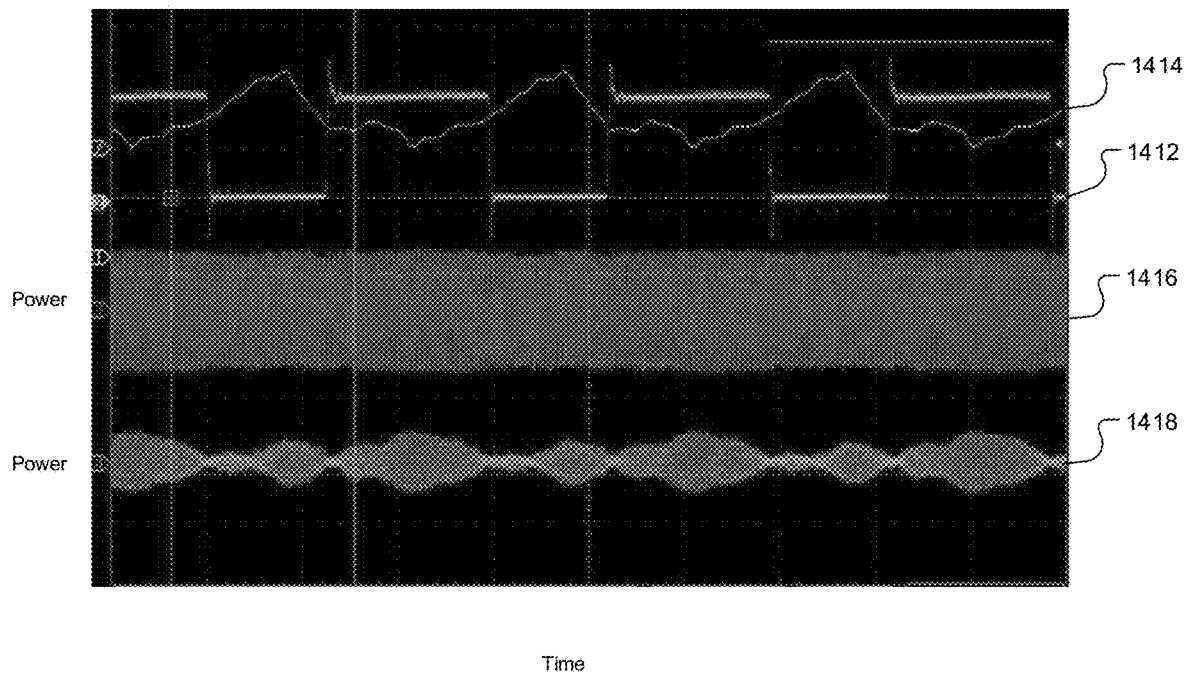
FIG. 14 shows voltage and power waveforms of a system having two RF signals applied to a load where periodic disturbance compensation is applied in accordance with the present disclosure.
Figure 15:
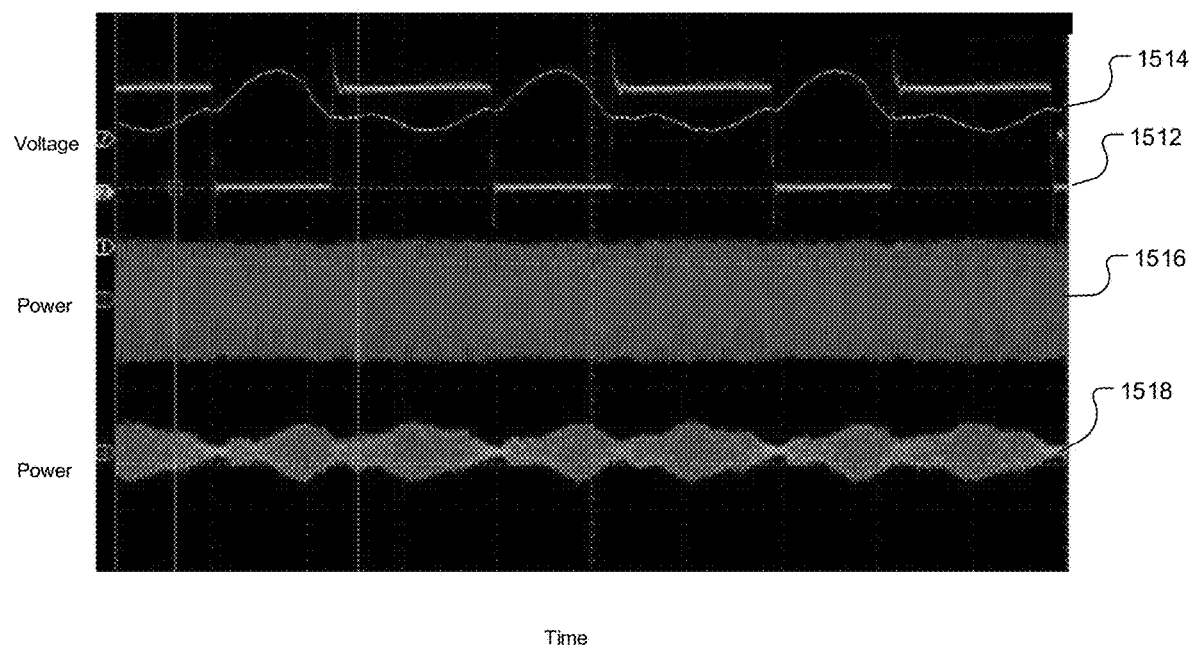
FIG. 15 shows voltage and power waveforms of the system of FIG. 15 in which periodic disturbance compensation further includes smoothing transitions between each compensation value.

FIGS. 14 and 15 indicate a difference in responsiveness of the system between a cost function with no smoothing, as shown in FIG. 14, and a cost function with smoothing, as shown in FIG. 15. Waveform 1412 represents a periodic synchronization signal associated with a low frequency or bias RF source, such as RF generator 712b of FIG. 7. Waveform 1414 represents a frequency of the high frequency or source RF generator, such as RF generator 712a of FIG. 7. Waveform 1414 represents frequency of the source RF generator over time and represents the adjustment pattern, correction pattern, or hopping pattern of RF generator 712a. FIG. 15 depicts waveforms similarly described with respect to FIG. 14, with waveform 1512 indicating a synchronization signal associated with bias RF generator 712b of FIG. 7 and waveform 1514 indicating the actual RF frequency of the source RF generator 712a of FIG. 7. Waveform 1514 indicates a correction pattern or hopping pattern used by the disturbance cancellation system approach to minimize the impact of IMD. As can be seen when comparing FIGS. 14 and 15, waveform 1514 has a smoother appearance than waveform 1414. With respect to both FIGS. 14 and 15, the reflected powers 1418, 1518 are generally similar. However, the additional smoothness in waveform 1514 resulting from applying a smoothing aspect to the cost function provides a smoother actuating profile. Such smoothness in the hopping profile can increase uniformity in the customer process.

Figure 16:
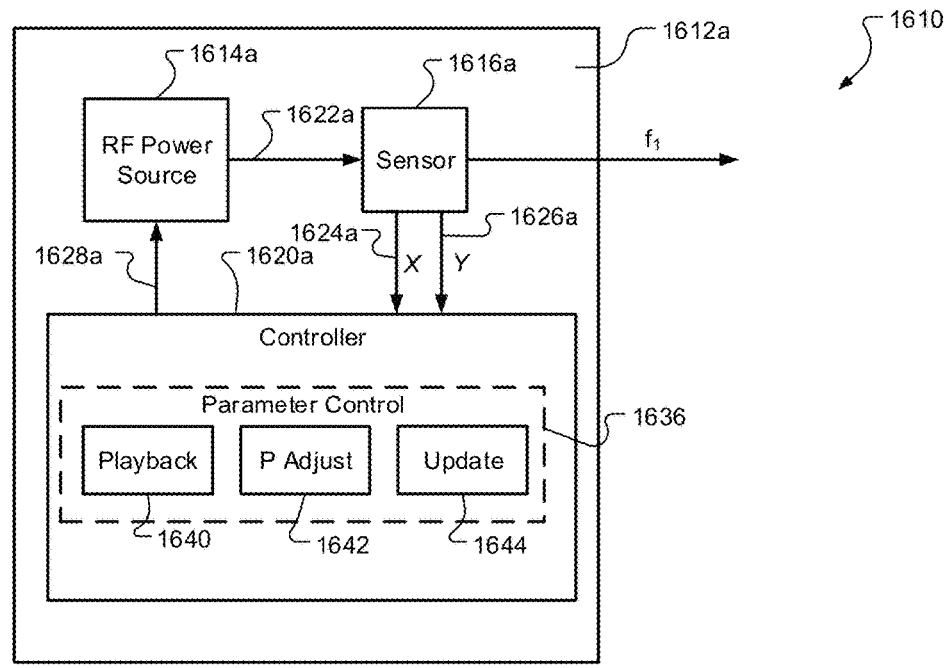
FIG. 16 shows an RF generator configured to compensate for periodic system disturbances.

FIG. 16 depicts an expanded block diagram of a RF generator, such as RF generator 712a of FIG. 7 in which controller 1620a includes amplitude parameter control section 1636. Parameter control section 1636 includes a playback module 1640, a parameter adjustment module 1642, and an update module 1644. Each module 1640, 1642, 1644 can be implemented collectively or individually as a process, a processor, a module, or a submodule. Further, each module 1640, 1642, 1644 can be implemented as any of the various components described below in connection with the term module. Playback module 1640 monitors for a triggering event or signal with which to synchronize the application of parameter corrections, adjustments, or offsets to RF signal $f_1$. The parameter adjustments may include frequency corrections, adjustments, or offsets in a frequency hopping pattern as described above. The corrections, adjustments, or offsets correspond to the n bins. Once playback module 1640 detects a triggering event or signal, playback module 1640 initiates application of parameter adjustments or offsets to RF signal $f_1$. Playback module 1640 cooperates with respective parameter adjustment module 1642. Parameter adjustment module 1642 provides parameter adjustments to respective update module 1644, which coordinates the application of respective parameter adjustments or offsets to RF signal $f_1$. The parameter adjustments may alternatively be one or a number of electrical parameters such as frequency, power, amplitude, phase, impedance matching network settings, and the like.

In various embodiments, parameter adjust module 1642 may be implemented as a lookup table (LUT). The parameter adjustments are determined in accordance with, for example, a timing or synchronization relative to a triggering event or signal. Given the periodic nature of bias RF signal $f_2$ from FIG. 7 and the expected periodic impedance fluctuations that occur in response to application of RF signal $f_2$ to the load 732, a LUT of the adjustments or offsets for RF signal $f_1$ are determined as described above with respect to FIG. 13. The parameter adjustments, offsets, or hops added to RF signal $f_1$ are generated to align with the dynamic impact on the load 732 introduced by RF generator 12b and improve the efficiency through selective and coordinated frequency adjustment by RF source generator 1612a and at least partially cancels the periodic bias signal induced IMD. In various embodiments, the LUT can be predetermined and static during operation or adjusted dynamically with an update process, such as with update module 1644 that implement the ILC approach described above. In various other embodiments, the parameter adjustments can be determined dynamically.

Figure 17:
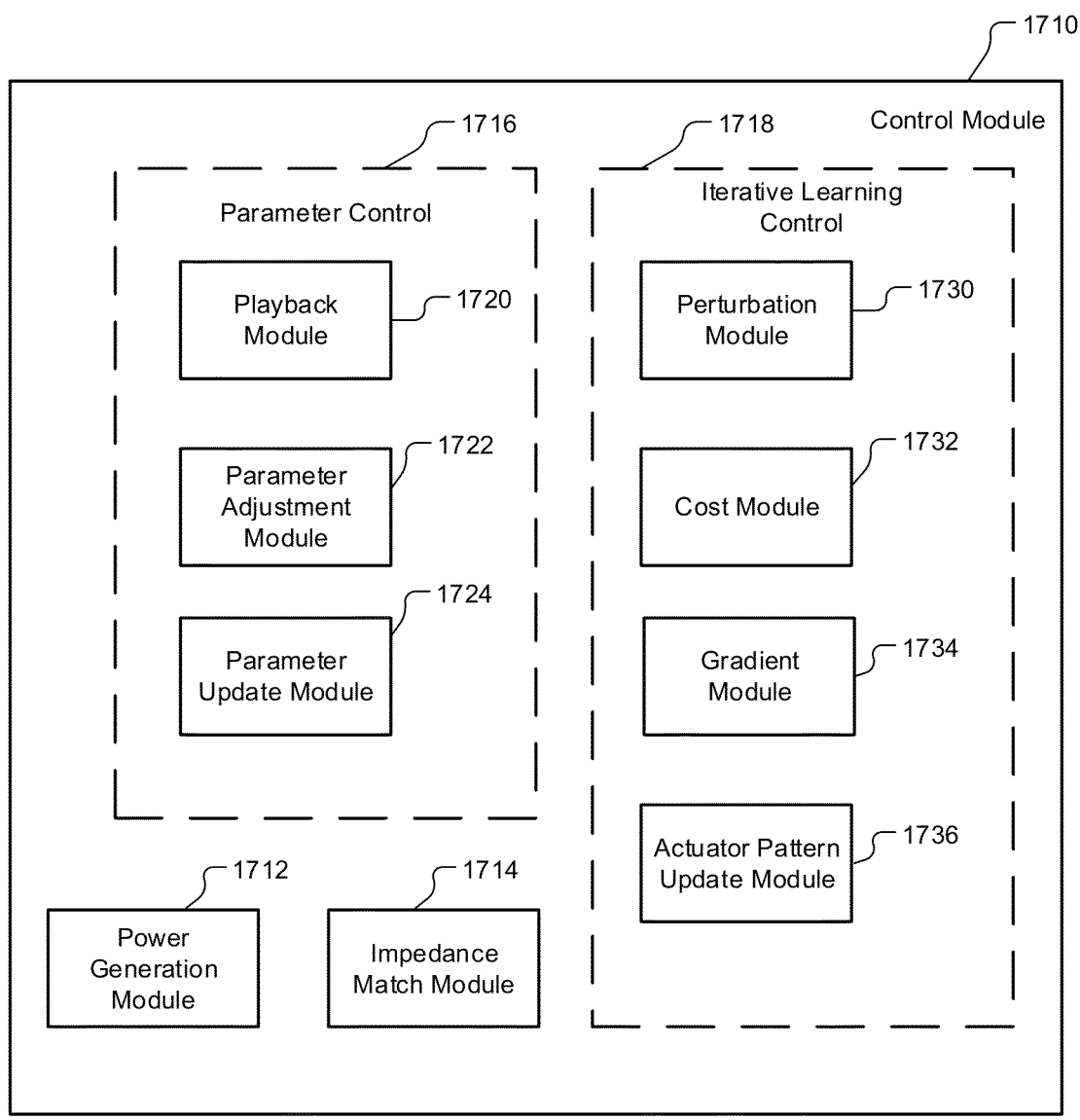
FIG. 17 shows a functional block diagram of an example control module arranged in accordance with various embodiments.

FIG. 17 shows a control module 1710. Control module 1710 incorporates various components of FIGS. 2-16. Control module 1710 may include power generation module 1712, impedance match module 1714, parameter control section 1716, and iterative learning control section 1718. Parameter control section 1712 includes playback module 1720, parameter adjustment module 1722, and parameter update module 1724. Iterative learning control section 1718 includes perturbation module 1730, cost module 1732, gradient module 1734, and actuator pattern update module 1736. In various embodiments, control module 1710 includes one or a plurality of processors that execute code associated with the module sections or modules 1712, 1714, 1716, 1718, 1720, 1722, 1724, 1730, 1732, 1734, and 1736. Operation of the module sections or modules 1712, 1714, 1716, 1718, 1720, 1722, 1724, 1730, 1732, 1734, and 1736 is described below with respect to the method of FIG. 18.

Figure 18:
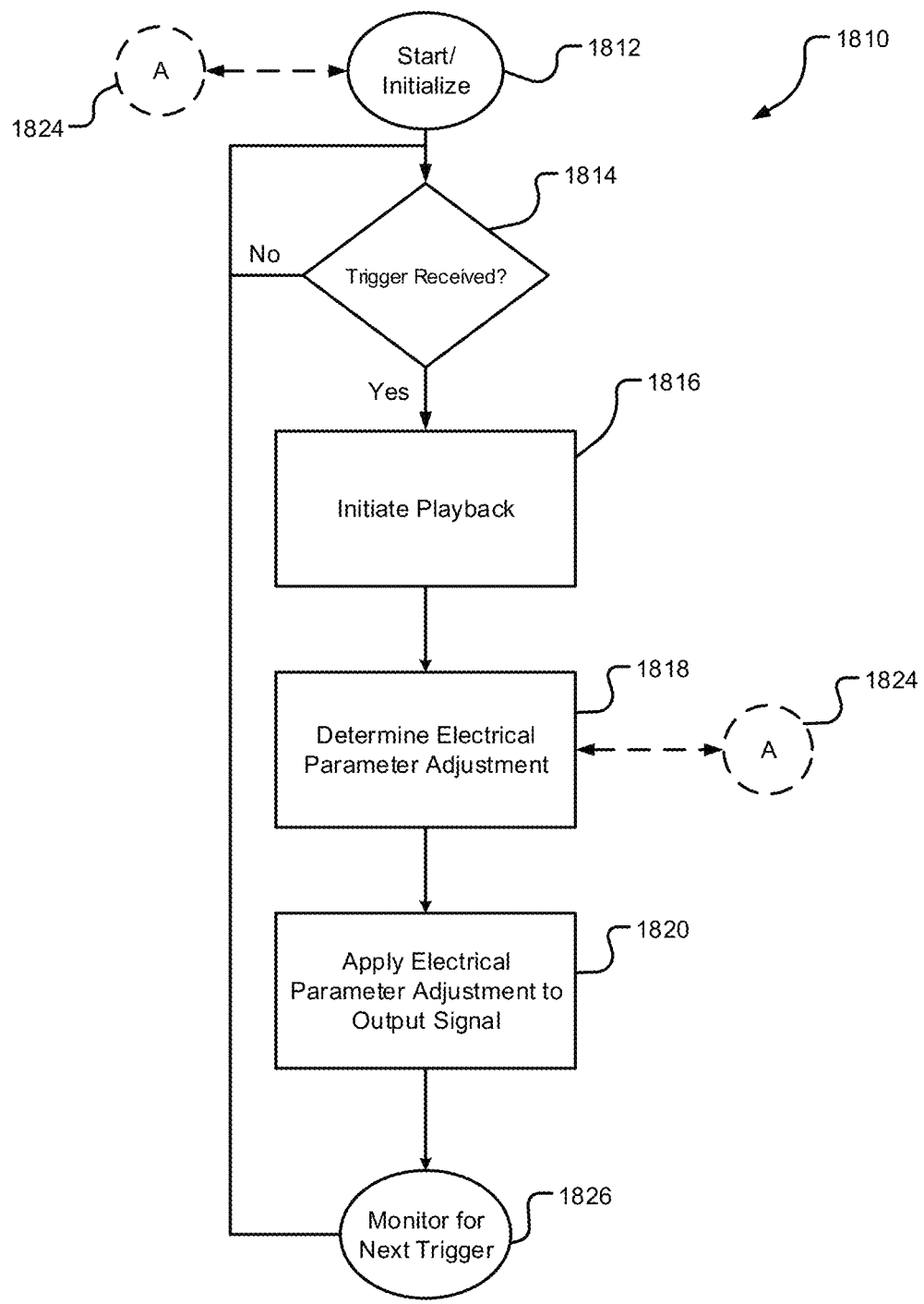
FIG. 18 shows a flow chart of operation of a control system arranged in accordance with the principals of the present disclosure.

For further defined structure of controllers 20a, 20b, 20' and 1612a of FIGS. 7 and 16, see the below provided flow chart of FIGS. 18 and the below provided definition for the term "module". The systems disclosed herein may be operated using numerous methods, examples, and various control system methods of which are illustrated in FIG. 18. Although the following operations are primarily described with respect to the implementations of FIGS. 12, 13, and 16, the operations may be easily modified to apply to other implementations of the present disclosure. The operations may be iteratively performed. Although the following operations are shown and primarily described as being performed sequentially, one or more of the following operations may be performed while one or more of the other operations are being performed.

FIG. 18 depicts a flow diagram 1810 of the IMD mitigation system described above. Control begins at block 1812 in which various parameters are initialized. Control proceeds to block 1814 which monitors for a trigger event. A trigger event can be any event which allows suitable alignment of a parameter adjustment, correction, or hopping pattern with RF signal $f_1$ output by RF generator 1612a. Block 1814 continues to monitor whether a trigger event has occurred and loops back in a wait state until such an event has occurred. Upon detection of a trigger event, control proceeds to block 1816 which initiates playback of a parameter compensation pattern synchronized to the occurrence of the triggering event.

Once playback is initiated, control proceeds to block 1818. At block 1818, parameter adjustments are determined relative to the trigger event. The parameter adjustments that form a correction pattern are in various embodiments determined in accordance with an expected impedance fluctuation referenced to an event, such as sequencing of an RF signal output from bias RF generator 712b of FIG. 7. Once the parameter adjustments or corrections are determined, typically in relation to the trigger event, control proceeds to block 1820 in which the parameter adjustments are applied, such as by applying parameter adjustments or offsets in a pattern to the RF signal output from RF generator 1612a. The one or a plurality of adjustments or corrections can include frequency. Control proceeds to block 1826 which returns control to monitor for a next trigger.

Also shown in FIG. 18 are blocks 1824 which call the iterative learning control flowchart of FIG. 12. Blocks 1824 are shown in phantom to indicate that the parameter compensation pattern can be executed prior to occurrence of a triggering event, shown by connection to block 1812. The parameter adjustment pattern remains fixed until updated. In an alternative approach, the parameter adjustment pattern may be updated dynamically, as shown by connection to block 1818.

In various embodiments the trigger event, such as discussed with respect to block 1814, is intended to synchronize bias RF generator 712b with source RF generator 712a or 1612a or so that parameter adjustments can be appropriately applied relative to the bias RF signal, thereby minimizing impedance fluctuation. Synchronization between RF generators 712a or 1612a and 712b can occur using control signal 730 or 730' which may provide a synchronization pulse or may replicate the RF signal output from RF generator 712b. In various other embodiments, synchronization with RF generator 712b can occur without a direct connection such as control signal 730 or 730' or other direct connection between RF generators 712a or 1612a and 712b.

Synchronization without a direct connection can be achieved by analyzing the impedance fluctuation and phase-locking to a signal indicating the impedance fluctuation. For example, by analyzing signals X,Y output from sensor 716a or 1616a, a signal indicating the impedance fluctuations can be generated. This signal can provide the appropriate trigger event. A signal indicating impedance fluctuation can be developed by performing a Fast Fourier transform (FFT) on the impedance fluctuation. In this configuration, the source RF generator 712a or 1612a can effectively work as a standalone unit without connection to bias RF generator 712b.

The trigger events described in the various embodiments above are typically related to a periodicity of the trigger event. For example, the control signal received from bias RF generator 712b output control signal 730 or 730' may repeat periodically in accordance with the RF signal output from RF generator 712b. Similarly, the above-discussed signal indicating an impedance fluctuation may also have a periodicity to it.

In various embodiments, varying perturbation patterns can be employed to estimate the required gradient information. By way of nonlimiting example, bins can be grouped, such as shown at sections 1124, 1126 of FIG. 11, and the group bins can be perturbed simultaneously to identify local gradients. In various other embodiments, the amplitude of the perturbation signal can be adjusted as a function of the magnitude of the cost metric. That is, as the cost metric approaches zero, the amplitude of the perturbation can be correspondingly reduced as well.

In various other embodiments, alternate basisfunctions can be used to reduce the number of parameters that must be optimized. That is, with respect to FIGS. 14 and 15, waveforms 1414 and 1514, respectively, can be selected as a correction pattern. Rather than perturbing each bin individually to determine a local gradient and learning independent actuator values for each bin of the correction pattern or hopping pattern, a predetermined adjustment or hopping pattern can be applied, and a DC offset and scaling factor can be used to adjust the hopping pattern. In various other embodiments, the shape of the adjustment pattern or hopping pattern may be fairly consistent under varying operating conditions. When using a predetermined hopping pattern and varying a DC offset and scaling the hopping profile or correction profile, the approach described in FIGS. 12 and 13 can be used to determine variations in the DC offset and scaling of the hopping profile. In various other embodiments, a DC offset and an orthogonal initial hopping pattern or adjustment pattern and additional basis vectors orthogonal to each of the DC shift and initial hopping pattern and to each other enable capturing more granular characteristics of the hopping pattern. The orthogonal basis set can be determined prior to initiating fabrication process steps in the reactor or can be learned dynamically as a data dependent basis set.

The system and method described above enables constant power delivery from an RF source in the presence of periodic load disturbances, such as a source RF generator maintaining constant power delivery in the presence of a lower frequency bias RF generator. The method and system described above also enables significant reduction in the reflected power at the source RF generator by reducing IMD induced by a second, lower frequency generator, such as a bias RF generator, connected to the same load. Reduction of IMD allows for less costly hardware for the same delivered power output from the source RF generator.

The apparatus methods described herein also enable an automated approach to determining the required actuator profile of the generator, such as a frequency hopping pattern or correction pattern. It will be actuated synchronously with the period of the lower frequency, bias RF generator. The system and methods described herein also enable maintaining a constant delivered power through a reduced reflected power profile during semiconductor fabrication in the non-linear reactor. This automated tuning approach improves upon a manually implemented approach that is slower and cannot be implemented dynamically.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase at least one of A, B, and C should be construed to mean a logical (A OR B OR C), using a non-exclusive logical OR, and should not be construed to mean "at least one of A, at least one of B, and at least one of C." The term subset does not necessarily require a proper subset. In other words, a first subset of a first set may be coextensive with (equal to) the first set.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Nonlimiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, ObjectiveC, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A radio frequency (RF) generator comprising:
a RF power source; and
a RF power controller coupled to the RF power source, the RF power controller configured to generate a control signal to vary an RF output signal from the RF power source, the RF power controller configured to adjust a parameter associated with the RF output signal in accordance with a synchronization signal, wherein the parameter is adjusted in accordance with one of minimizing or maximizing a cost function responsive to introduction of a perturbation of the parameter.

2. The RF generator of claim 1, wherein the cost function is determined in accordance with one of reflected power, delivered power, or magnitude of a reflection coefficient.

3. The RF generator of claim 1, wherein a gradient is determined in accordance with the cost function, and the parameter is adjusted in accordance with the gradient.

4. The RF generator of claim 1, wherein the parameter is adjusted in accordance with a plurality of adjustments arranged in a pattern.

5. The RF generator of claim 4, wherein the pattern varies in accordance with a period of an external RF output signal.

6. The RF generator of claim 5, wherein the external RF output signal comprises a plurality of bins, and wherein the parameter is perturbed in accordance with each bin of the plurality.

7. The RF generator of claim 5, wherein each bin has a width and the width of a selected bin may be the same as or different than a width of another bin.

8. The RF generator of claim 1, wherein the RF output signal is a source RF signal applied to a plasma chamber and the synchronization signal varies in accordance with an external RF output signal, and the external RF output signal is a bias RF signal applied to the plasma chamber.

9. The RF generator of claim 1, wherein the RF power controller adjusts the parameter in accordance with the synchronization signal, wherein the synchronization signal indicates a relative position of an external RF output signal.

10. The RF generator of claim 1, wherein the RF power controller is configured to adjust the parameter based on values stored in memory or determined dynamically.

11. The RF generator of claim 1, wherein the parameter is one of a frequency or a frequency offset and includes a plurality of frequencies that the RF power controller introduces to the RF output signal in a predetermined order and timing in accordance with the synchronization signal.

12. The RF generator of claim 1, wherein the parameter one of a reactance or a reactance offset and includes a plurality of reactances controlled by the RF power controller in a predetermined order and timing in accordance with the synchronization signal, wherein the reactance is at least one of a capacitance or an inductance.

13. The RF generator of claim 12, wherein the at least one of a capacitance or an inductance is varied with a respective electronically variable capacitance or an electronically variable inductance.

14. The RF generator of claim 1, wherein the cost function varies in accordance with an intermodulation distortion caused by an external RF output signal.

15. The RF generator of claim 1, wherein the RF power controller further comprises a playback module, the playback module configured to detect the synchronization signal and to initiate adjustment of the parameter.

16. The RF generator of claim 15, wherein the RF power controller further comprises a lookup table configured to store multiple adjustments of the parameter by the playback module following detection of the synchronization signal.

17. The RF generator of claim 1 wherein the synchronization signal is one of periodic or non-periodic.

18. The RF generator of claim 1, wherein the parameter is perturbed in accordance with a correction pattern.

19. The RF generator of claim 18 wherein the correction pattern may be varied by at least one of applying an offset to the correction pattern or applying a scaling factor to the correction pattern.

20. The RF generator of claim 19 wherein the parameter is adjusted by at least one of applying the offset or applying the scaling factor to the correction pattern.

21. The RF generator of claim 20, wherein the RF output signal comprises a plurality of bins, and wherein the correction pattern determines the perturbation of the parameter for each bin of the plurality.

22. The RF generator of claim 21 wherein varying the correction pattern correspondingly varies the perturbation for each bin of the plurality.

23. The RF generator of claim 18 wherein the parameter is perturbed in accordance with the correction pattern and a second pattern orthogonal to the correction pattern.

24. A radio frequency (RF) generator comprising:
a RF power source; and
a RF power controller coupled to the RF power source, the RF power controller configured to generate a control signal to vary an RF output signal from the RF power source, the RF power controller configured to adjust a parameter associated with the RF output signal in accordance with a synchronization signal,
wherein the parameter is perturbed in accordance with a correction pattern, and the parameter is adjusted in accordance with one of minimizing or maximizing a cost function responsive to perturbation of the parameter by the correction pattern, and
wherein the correction pattern may be varied by applying an offset to the correction pattern or applying a scaling factor to the correction pattern.

25. The RF generator of claim 24, wherein the RF output signal comprises a plurality of bins, and wherein the correction pattern determines the perturbation of the parameter for each bin of the plurality.

26. The RF generator of claim 24 wherein varying the correction pattern correspondingly varies the perturbation for each bin of the plurality.

27. The RF generator of claim 26, wherein each bin has a width and the width of a selected bin may be the same as or different than a width of another bin.

28. The RF generator of claim 24 wherein the parameter is perturbed in accordance with the correction pattern and a second pattern orthogonal to the correction pattern.

29. The RF generator of claim 24, wherein the RF power controller adjusts the parameter in accordance with the synchronization signal, wherein the synchronization signal indicates a relative position of an external RF output signal.

30. The RF generator of claim 24, wherein:
the parameter is one of a frequency or a frequency offset and includes a plurality of frequencies that the RF power controller introduces to the RF output signal in a predetermined order and timing in accordance with the synchronization signal, or
the parameter one of a reactance or a reactance offset and includes a plurality of reactances controlled by the RF power controller in a predetermined order and timing in accordance with the synchronization signal, wherein the reactance is at least one of a capacitance or an inductance.

* * * * *